United States Patent [19]

Machida

[11] Patent Number: 5,166,875
[45] Date of Patent: Nov. 24, 1992

[54] RECONSTRUCTING TWO AND THREE DIMENSIONAL IMAGES BY TWO AND THREE DIMENSIONAL FOURIER TRANSFORMS IN AN MRI SYSTEM

[75] Inventor: Yoshio Machida, Nishinasonomachi, Japan

[73] Assignee: Kabushiki Kaisha Toshiba, Kawasaki, Japan

[21] Appl. No.: 437,608

[22] Filed: Nov. 17, 1989

[30] Foreign Application Priority Data

Nov. 21, 1988 [JP] Japan .................. 63-293886

[51] Int. Cl.$^5$ ............... G06F 15/00; G01V 3/00
[52] U.S. Cl. .................... 364/413.13; 364/413.22; 395/124; 324/309
[58] Field of Search .......... 364/413.13, 413.02, 364/413.22, 413.19; 324/309, 306, 307; 395/124, 125, 127

[56] References Cited

U.S. PATENT DOCUMENTS

| | | |
|---|---|---|
| 4,593,247 | 6/1986 | Glover ........................ 324/309 |
| 4,701,709 | 10/1987 | Yamamoto et al. ............ 324/309 |
| 4,799,013 | 1/1989 | Hatanaka ..................... 324/309 |
| 4,803,431 | 2/1989 | Sano et al. .................. 324/309 |
| 4,812,762 | 3/1989 | Den Boef .................... 324/309 |
| 4,825,159 | 4/1989 | Oppelt et al. ................ 324/309 |
| 4,939,462 | 7/1990 | Maeda et al. ................ 324/309 |
| 4,958,282 | 9/1990 | Barjhoux ................. 364/413.13 |
| 4,978,918 | 12/1990 | Sakamoto ................... 324/309 |

*Primary Examiner*—Gail O. Hayes
*Assistant Examiner*—Xuong Chung
*Attorney, Agent, or Firm*—Foley & Lardner

[57] ABSTRACT

In an MRI system, three dimensional data is acquired from a specific three dimensional region of a subject to be examined. An image reconstruction process using two dimensional Fourier transform is performed for two dimensional data in one direction of the three dimensional data. An image reconstruction process using three dimensional Fourier transform is performed for the three dimensional data. In this case, a two dimensional image is displayed before a three dimensional image is displayed.

4 Claims, 9 Drawing Sheets

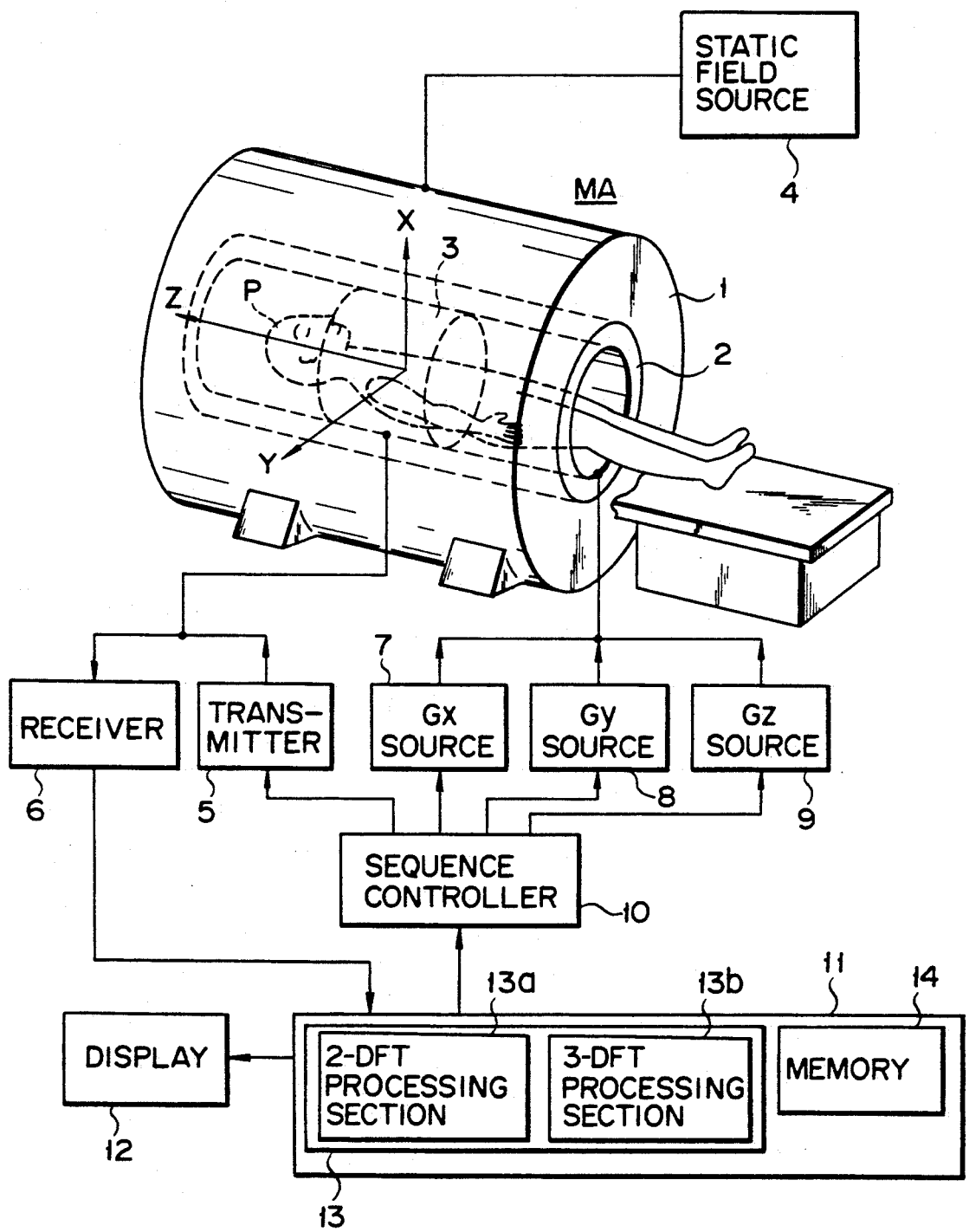
F I G. 1

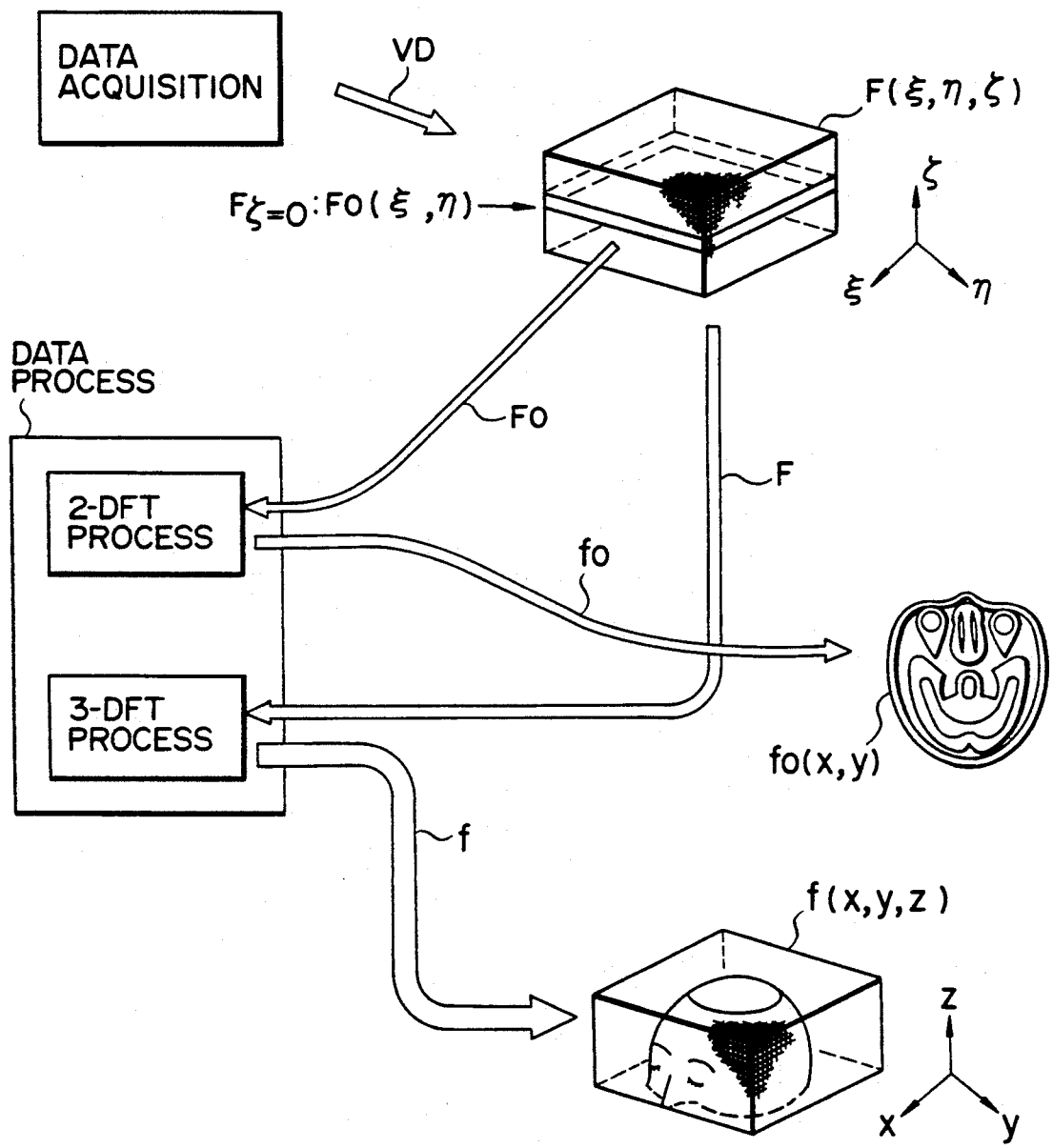
F I G. 4

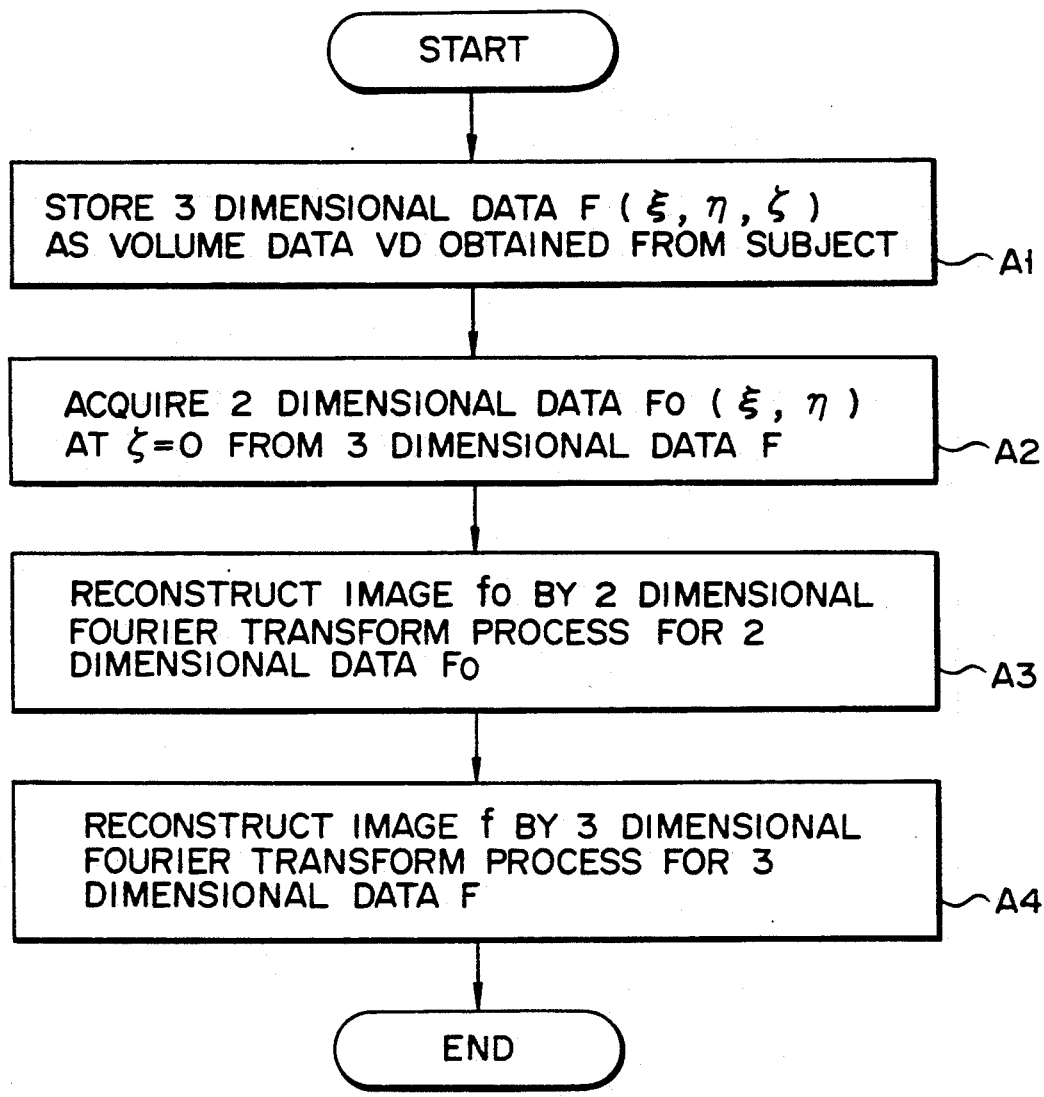
F I G. 5

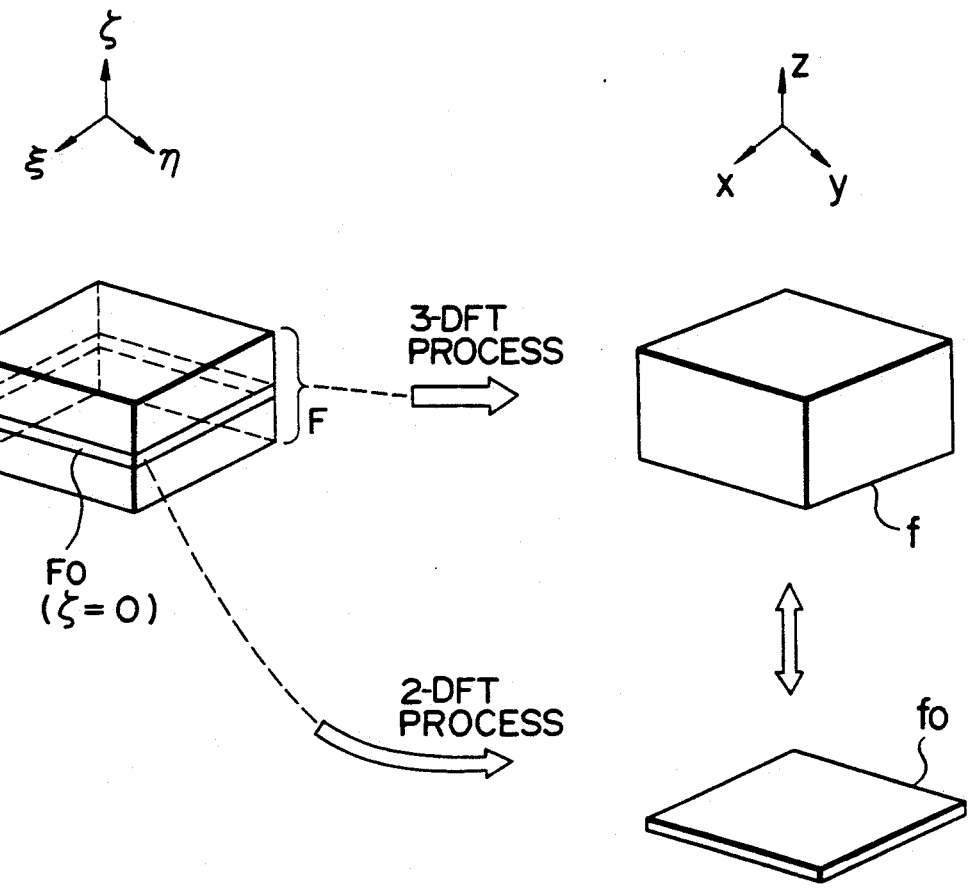
F I G. 6

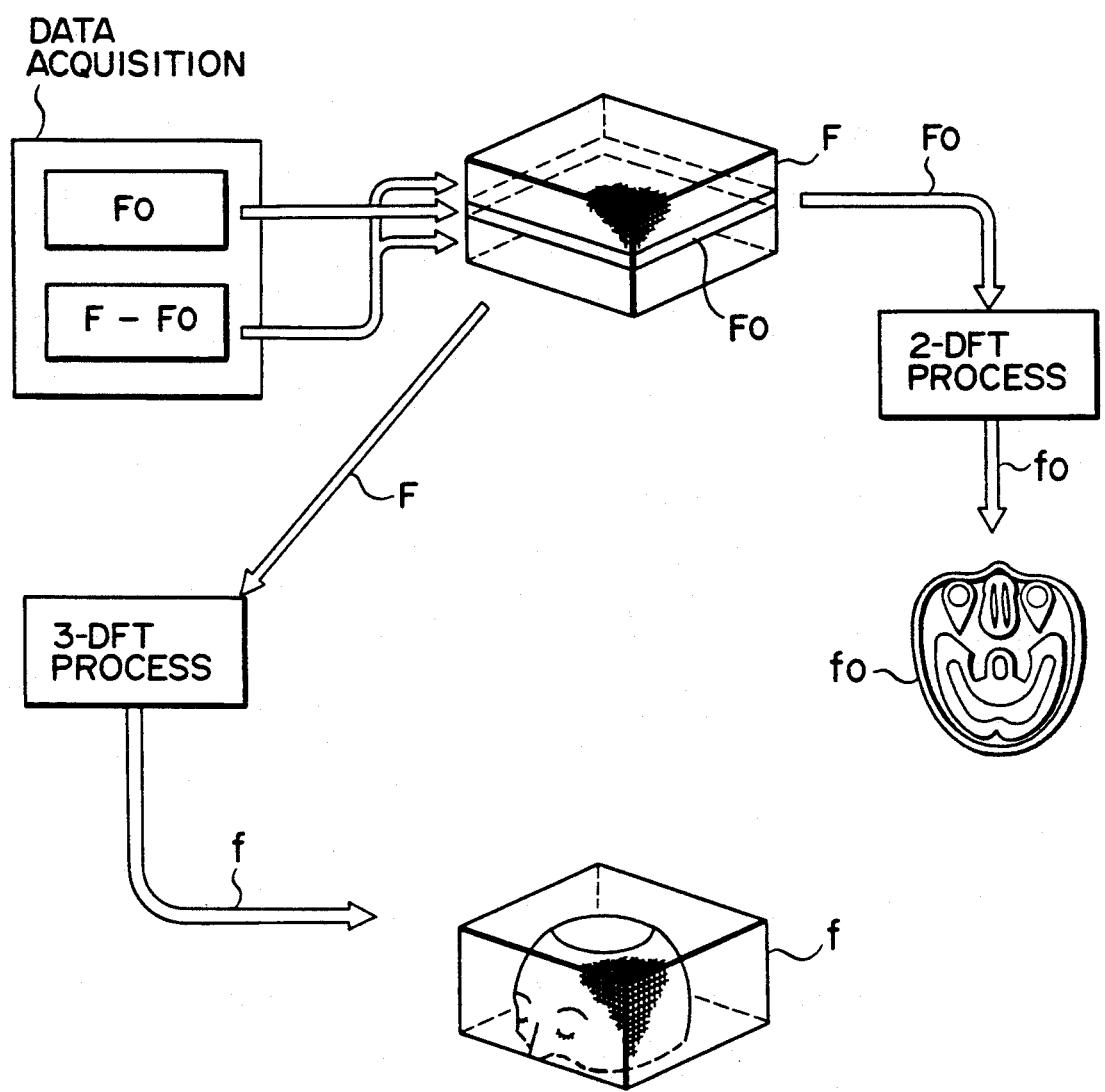
F I G. 8

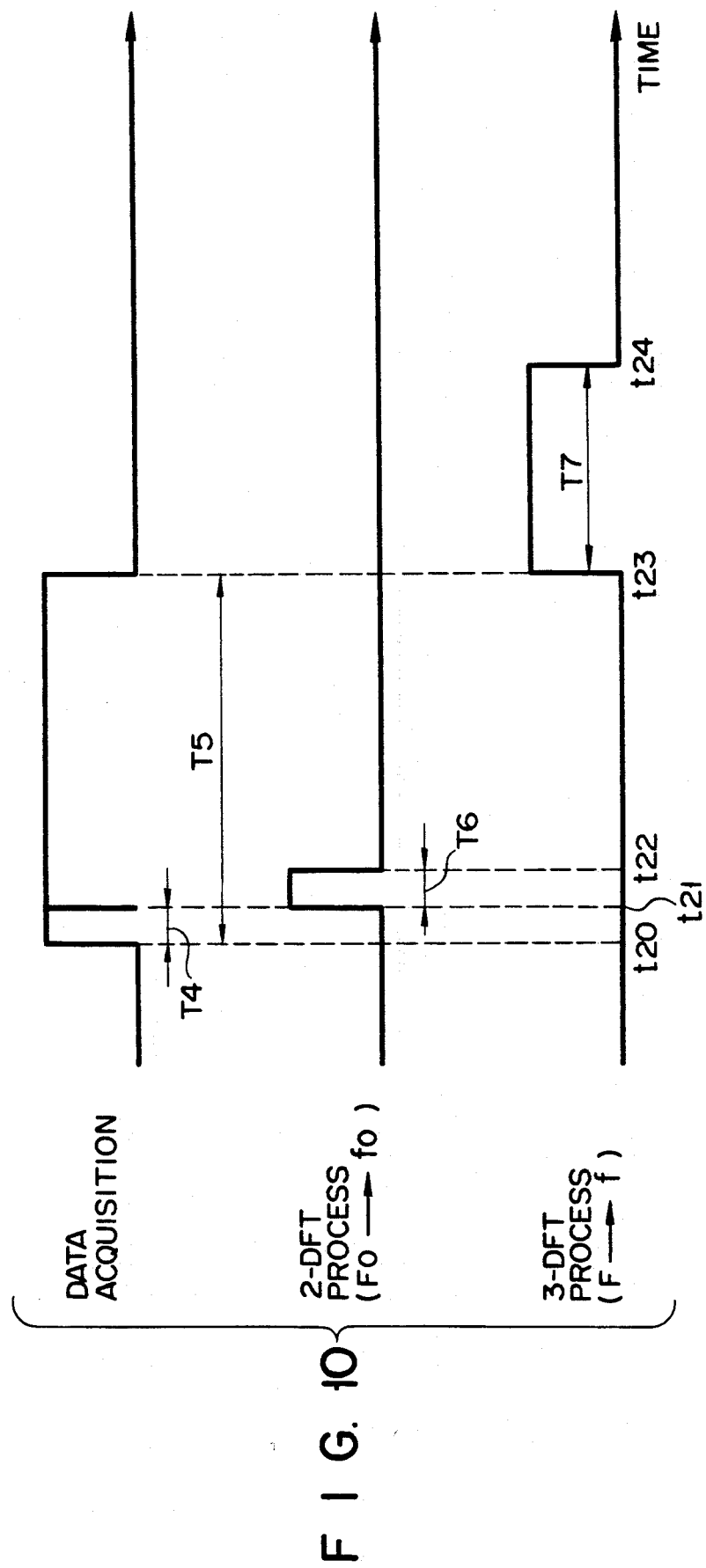
F I G. 10

RECONSTRUCTING TWO AND THREE DIMENSIONAL IMAGES BY TWO AND THREE DIMENSIONAL FOURIER TRANSFORMS IN AN MRI SYSTEM

BACKGROUND OF THE INVENTION

1. Field of the Invention

The present invention relates to a method and system for processing image data in MRI (Magnetic Resonance Imaging).

2. Description of the Related Art

A magnetic resonance phenomenon is a phenomenon in which an atomic nucleus having a spin and a magnetic moment which are not zero, in a static field, resonantly absorbs/emits only an electromagnetic wave having a specific frequency. This atomic nucleus resonates at an angular frequency $\omega_0$ ($\omega_0 = 2\pi\nu_0$, $\nu_0$: Larmor frequency) given by the following equation:

$$\omega_0 = \gamma H_0$$

where $\gamma$ is the gyromognetic ratio inherent in the type of atomic nucleus, and $H_0$ is the static field strength.

An MRI apparatus detects an electromagnetic wave excited by the phenomenon as an MR (Magnetic Resonance) signal, and processes the MR signal, thus acquiring diagnostic data, e.g., a slice image of a subject, from information such as an atomic nucleus density, a longitudinal relaxation time T1, a transverse relaxation time T2, a flow, and a chemical shift.

Diagnostic data of all the portions of a subject placed in a static field can be acquired. In an actual apparatus, however, diagnostic data of a specific portion is acquired due to the limitations of an apparatus design or clinical requirements of an image.

In this case, a two dimensional Fourier transform method and a three dimensional Fourier transform method which are classified as phase-encoding methods are used as imaging methods. In the two dimensional Fourier method, data of a specific two dimensional surface (having a predetermined thickness) of a subject to be examined, i.e., two dimensional data (slice data) is acquired. In the three dimensional Fourier transform method, data of a specific three dimensional region of the subject, i.e., three dimensional data (volume data) is acquired. By performing image reconstruction processes on these data, a two dimensional image (slice image) and a three dimensional image (stereoscopic image) are reconstructed.

Note that an arbitrary sectional image can be acquired by an image reconstruction method and a high-speed arbitrary sectional image reconstruction method utilizing three dimensional Fourier transform with respect to the three dimensional data. In addition, a stereoscopic image viewed from a desired direction can be acquired by the image reconstruction method and a three dimensional surface display method utilizing Fourier transforms with respect to the three dimensional data.

The above-described arbitrary sectional image and stereoscopic image can be effectively used for diagnosis and simulation of a surgical operation. If, for example, a stereoscopic image acquired by volume-scanning a head as a diagnosis portion, and sagittal, coronal, and axial sectional images of arbitrary portions of the stereoscopic image are displayed, the three dimensional position and range of a lesion present in the head can be clearly recognized.

In order to acquire the above stereoscopic image or the arbitrary sectional images, however, a data acquisition time of several minutes to several tens minutes is required. Even if a special arithmetic unit is employed, it takes several minutes to perform data processing.

As described above, when an image is to be acquired by the image reconstruction method utilizing three dimensional Fourier transform, a long period of time is consumed from the start of scanning till an image display. For this reason, in an image diagnosis process, the diagnostic efficiency of the doctor is degraded.

Therefore, a strong demand has arisen for an apparatus for performing image processing and an image display of two and three dimensional data so as to clearly recognize the three dimensional position and range of a lesion.

SUMMARY OF THE INVENTION

It is an object of the present invention to provide a method and system for processing image data in an MRI.

According to one aspect of the present invention, there is provided a method for processing image data in an MRI, the method comprising the steps of:

acquiring two dimensional data;

reconstructing a two dimensional image by a two dimensional Fourier transform process for the acquired two dimensional data;

displaying the reconstructed two dimensional image;

acquiring first three dimensional data outside the acquired two dimensional data;

reconstructing a second three dimensional image by a three dimensional Fourier transform process for second three dimensional data including the acquired two dimensional data and the first three dimensional data; and displaying the reconstructed second three dimensional image.

According to another aspect of the present invention, there is provided a system for processing image data in an MRI, the system comprising:

acquiring means for acquiring three dimensional data including two dimensional data;

storing means for storing the three dimensional data;

reconstructing means for reconstructing a two dimensional image by a two dimensional Fourier transform process for the two dimensional data, and reconstructing a three dimensional image by a three dimensional Fourier transform process for the three dimensional data;

displaying means for displaying the reconstructed two dimensional image and the reconstructed three dimensional image; and control means for controlling the storing means, the reconstructing means, and the displaying means in accordance with a desired image data processing sequence.

BRIEF DESCRIPTION OF THE DRAWINGS

FIG. 1 shows an arrangement of a system according to an embodiment of the present invention;

FIG. 4 shows operation of an image reconstructing unit according to the first embodiment of the present invention;

FIG. 5 is a flow chart of the operation of the image reconstructing unit according to the first embodiment of the present invention;

FIG. 6 shows a relationship between images acquired by two and three dimensional Fourier transform processes, respectively;

FIG. 8 shows operation of an image reconstructing unit according to the second embodiment of the present invention;

FIG. 10 shows a timing chart for the process timing of the second embodiment.

DETAILED DESCRIPTION OF THE PREFERRED EMBODIMENTS

Figure 2:
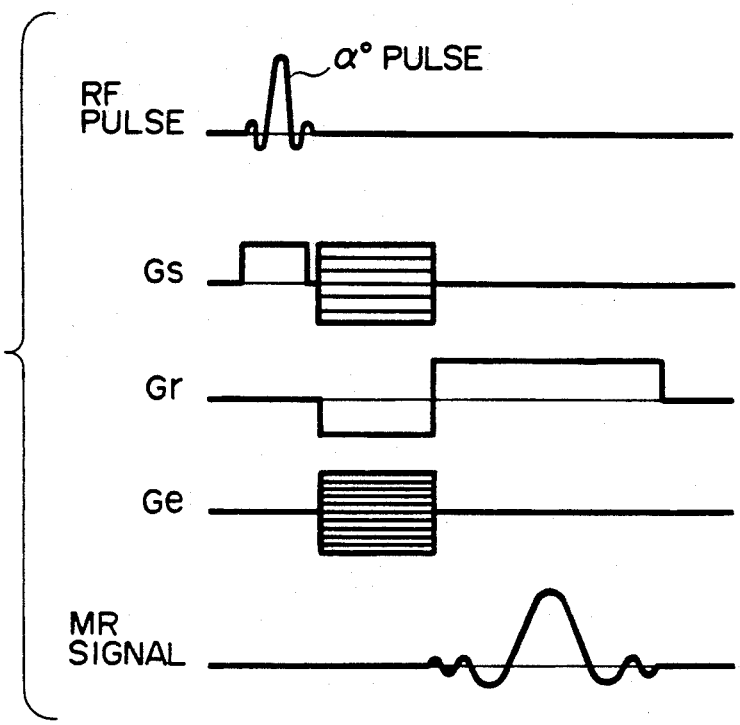
FIG. 2 shows a pulse sequence of the embodiment.

Embodiments of the present invention will be described below with reference to the accompanying drawings.

As shown in FIG. 1, in an embodiment system, a magnet assembly MA in which a subject P to be examined can be placed, includes a static field coil 1 constituted by a normal conductive or superconductive coil (a permanent magnet may be used), X-, Y-, and Z-axis gradient field generating coils for generating gradient fields to provide positional data of a desired portion of the subject P in which an MR signal is generated, and a transmission/reception coil 3 for transmitting an RF pulse and detecting an MR signal.

In addition, the system comprises: a static field source 4; a transmitter 5 for controlling transmission of an RF pulse; a receiver 6 for controlling reception of an MR signal; Gx, Gy, and Gz sources 7, 8, and 9 for respectively supplying power to the gradient field generating coils 2; a sequence controller 10 for controlling a pulse sequence for excitation and data acquisition; a computer system 11 for controlling the respective components and processing a detected MR signal; and a display 12. Note that the computer system 11 includes a memory 14 and an image reconstructing unit 13. The image reconstructing unit 13 is constituted by a two dimensional Fourier transform (2-DFT) processing section 13a and a three dimensional Fourier transform (3-DFT) processing section 13b.

In this case, an SE (Spin Echo) method using 90°-180° pulse sequence, or an FE (Gradient Field Echo) method in which an inverted gradient field is applied in place of a 180° pulse of the SE method is employed as a data acquisition pulse sequence.

Figure 3:
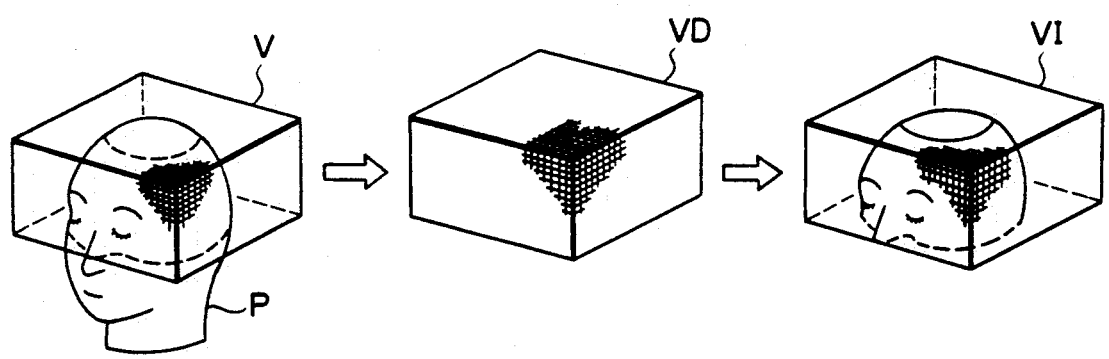
FIG. 3 shows data acquisition and image reconstruction.

For example, in a data acquisition sequence using the FE method shown in FIG. 2, an RF pulse (α° pulse) for determining a three dimensional excitation portion V of the subject P is applied from the transmission/reception coil 3 by the transmitter 5 (see FIG. 3). In addition, a slicing gradient field Gs, a phase encoding gradient field Ge, and a read gradient field Gr are respectively applied from the gradient field generating coils 2 by the sources 7, 8, and 9. As a result, an MR signal generated from the excitation portion V is detected by the transmission/reception coil 3.

Volume data VD is obtained by repeatedly executing this sequence by the number of times corresponding to a reconstruction matrix, and is stored in the memory 14. The image reconstructing unit 13 acquires three dimensional image data VI by performing an image reconstruction process for the volume data VD stored in the memory 14 utilizing three dimensional Fourier transform. With this process, a three dimensional surface image and an arbitrary sectional image of the excitation portion V are displayed on the display 12.

The first embodiment process of data acquisition and image reconstruction, in the above-described image reconstructing unit 13, will be described below with reference to FIGS. 4 and 5.

MR signals are repeatedly acquired from a three dimensional excitation portion of the subject P by the data acquisition pulse sequence using the FE method.

Referring to FIG. 5, in step A1, three dimensional data F ($\xi,\eta,\zeta$) obtained by the above pulse sequence is stored as volume data VD in the memory 14.

In step A2, three dimensional data F ($\xi,\eta,\zeta$) at $\zeta=0$, i.e., two dimensional data F0 ($\xi,\eta$) is acquired from the three dimensional data F ($\xi,\eta,\zeta$), and is stored in the memory 14.

Note that the two dimensional data F0 ($\xi,\eta$) and the three dimensional data F ($\xi,\eta,\zeta$) are transferred to the image reconstructing unit 13.

In step A3, a two dimensional Fourier transform process for the two dimensional data F0 ($\xi,\eta$) is performed by the processing section 13a so as to reconstruct an image f0.

In step A4, a three dimensional Fourier transform process for the three dimensional data F ($\xi,\eta,\zeta$) is performed by the processing section 13b so as to reconstruct an image f.

A relationship between the image f0 and the image f respectively obtained by the two and three dimensional transform processes will be described below with reference to FIG. 6.

The three dimensional data F ($\xi,\eta,\zeta$) can be represented as follows:

$$F(\xi,\eta,\zeta)=a1\int_E f(x,y,z)exp(2\pi i(\xi x+\eta y+\zeta z))dxdydz$$

where a1 is a constant, and E is the excitation region.

The two dimensional data F0 ($\xi,\eta$) at $\zeta=0$ can be given by the following equation:

$$F0(\xi,\eta)=a1\int_E f(x,y,z)exp(2\pi i(\xi x+\eta y))dxdydz$$

Therefore, the image f0 obtained by the two dimensional Fourier transform process for the data F0 is represented by the following equation:

$$f0(x,y)=a2\int f(x,y,z)dz$$

where a2 is a constant.

That is, projection data (perspective image) in the z-axis direction is obtained.

Figure 7:
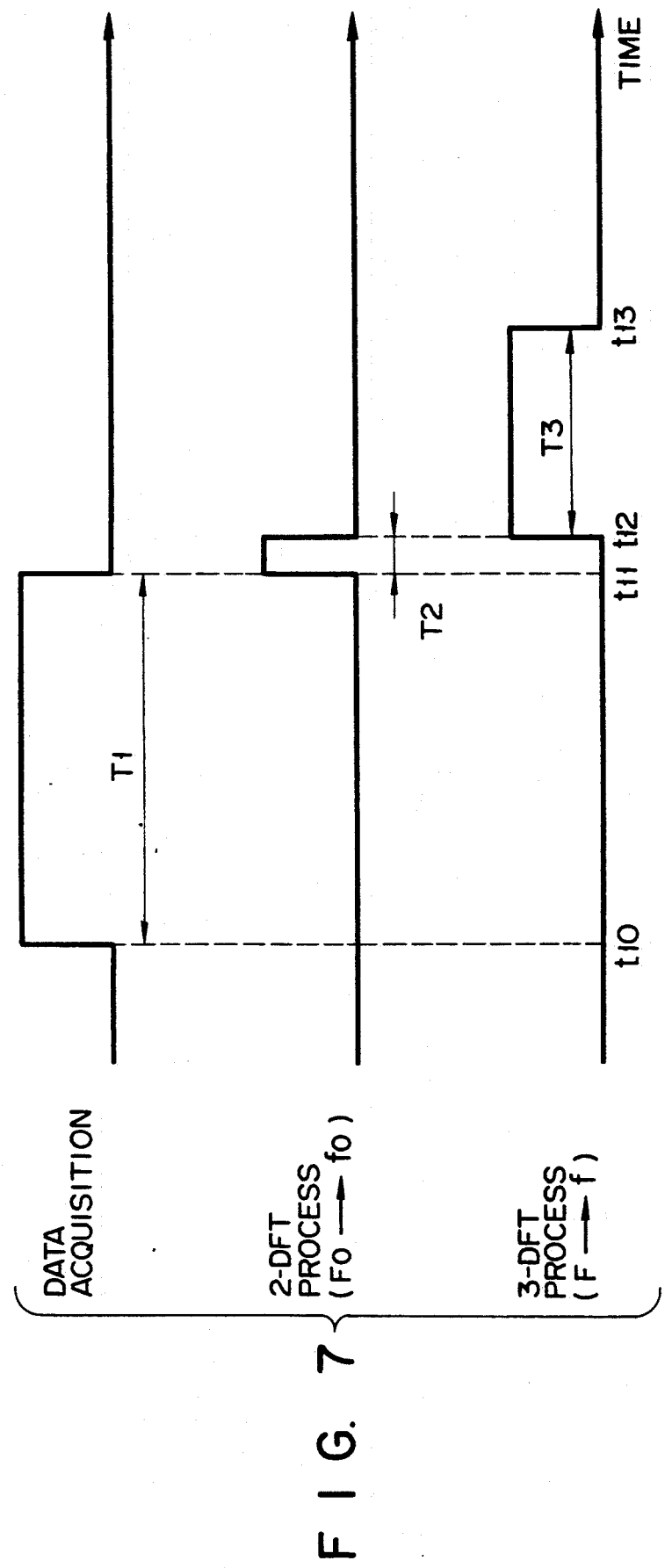
FIG. 7 is a timing chart for the process timing of the first embodiment.

A process time of the first embodiment will be described below with reference to FIG. 7.

Data acquisition is started at time t10 and is completed at time t11. The data acquisition time is given as T1. The two dimensional Fourier transform process for the two dimensional data F0 is started at time t11, and the image f0 is reconstructed at time t12. The Fourier transform process time for the two dimensional data F0 is given as T2.

The three dimensional Fourier transform process for the three dimensional data F is started at time t12, and the image f is reconstructed at time t13. The Fourier transform process time for the three dimensional data F is given as T3.

In this case, the data acquisition time T1 is several minutes to several tens of minutes. The process time T2 for reconstruction of the image f0 is several seconds, and the process time T3 for reconstruction of the image f is several minutes. Note that a result obtained by a two dimensional Fourier transform process can be used in a three dimensional Fourier transform process, and hence the process time T3 can be shortened.

In the conventional technique, an image display cannot be performed until after the process time T3, i.e., several minutes after data acquisition is completed. According to the first embodiment, however, the image f0 can be displayed when the process time T2 completes, i.e., several seconds data acquisition is completed. The image f0 can be used as a reference image. In addition, the image f can be displayed after the completion of the process time T3. Therefore, observation of the entire portion and a main portion of the image of a subject can be efficiently performed, and diagnosis by a doctor can be performed with high efficiency.

The second embodiment process of data acquisition and image reconstruction, in the image reconstructing unit 13 will be described below with reference to FIGS. 8 and 9.

Figure 9:
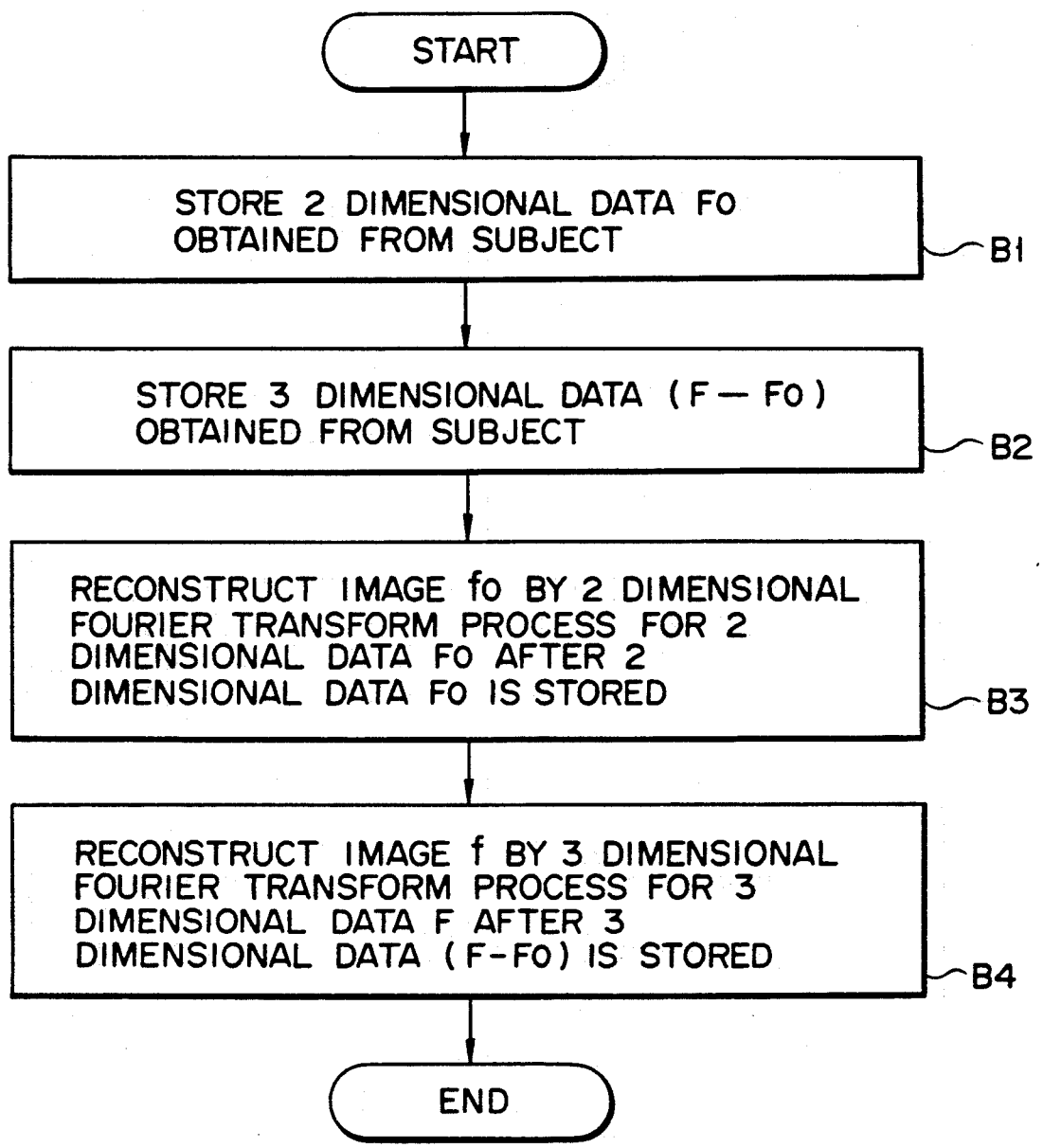
FIG. 9 is a flow chart of the operation of the image reconstructing unit according to the second embodiment.

Referring to FIG. 9, in step B1, two dimensional data F0 at the center of one direction (direction $\zeta$) of a three dimensional data region, i.e., $\zeta = 0$ is acquired by the data acquisition pulse sequence using the FE method, and is stored in the memory 14.

In step B2, three dimensional data (F-F0) outside the two dimensional data F0 is acquired and stored in the memory 14. As a result, three dimensional data F is obtained from the two dimensional data F0 and the three dimensional data (F-F0).

Note that the two and three dimensional data F0 and F are transferred to the image reconstructing unit 13.

In step B3, a two dimensional Fourier transform process for the two dimensional data F0 is performed by the processing section 13a so as to reconstruct an image f0.

In step B4, a three dimensional Fourier transform process for the three dimensional data F is performed by the processing section 13b so as to reconstruct an image f.

The image f0 becomes a projection image (perspective image) in the z-axis direction; and the image f, a three dimensional surface image and an arbitrary sectional image of the excitation portion.

A process time of the second embodiment will be described below with reference to FIG. 10.

Data acquisition is started at time t20. Acquisition of the second dimensional data F is completed at time t21. Acquisition of the three dimensional data F is completed at time t23. The data acquisition time for the second dimensional data F0 is given as T4. The data acquisition time for the three dimensional data F is given as T5. The two dimensional Fourier transform process for the two dimensional data F0 is started at time t21, and the image f0 is reconstructed at time t22. The Fourier transform process time for the two dimensional data F0 is given as T6.

The three dimensional Fourier transform process for the three dimensional data F is started at time t23, and the image f is reconstructed at time t24. The Fourier transform process time for the three dimensional data F is given as T7.

In this case, the data acquisition time T4 is several seconds, and the data acquisition time T5 is several minutes to several tens of minutes. The process time T6 for reconstruction of the image f0 is several seconds, and the process time T7 for reconstruction of the image f is several minutes. Note that a result obtained by a two dimensional Fourier transform process can be used for a three dimensional Fourier transform process, and hence the process time T3 can be shortened.

In the conventional technique, an image display cannot be performed until the time T3, i.e., several minutes, elapse after data acquisition is completed. According to the second embodiment, however, the image f0 can be displayed when a time T4+T6, i.e., several seconds from the start of data acquisition. The image f0 can be used as a reference image. In addition, the image f can be displayed after the further elapse of a time (T5−(T4+T6))+T7. Therefore, observation of the entire portion and a main portion of the image of a subject can be efficiently performed, and diagnosis by a doctor can be performed with high efficiency.

In the embodiments, the two dimensional data at $\zeta = 0$ is processed. However, two dimensional data at $\xi = 0$ or $\eta = 0$ can be processed. In addition, a data acquisition pulse sequence is not limited to the SE method and the FE method.

As described above, in the embodiments, three dimensional data is acquired from a specific three dimensional region of a subject, and an image reconstruction process using two dimensional Fourier transform is performed for two dimensional data in one direction of the three dimensional data. An image reconstruction process using three dimensional Fourier transform is performed for the three dimensional data.

In addition, two dimensional data in one direction of three dimensional data is acquired from a specific three dimensional region of a subject. An image reconstruction process using two dimensional Fourier transform is performed for this two dimensional data. Subsequently, three dimensional data outside the two dimensional data is acquired. An image reconstruction process is performed by three dimensional Fourier transform on the basis of the two and three dimensional data.

Since a two dimensional image is acquired in this manner before reconstruction of a three dimensional image is completed, diagnosis based on the two dimensional image can be performed in the interval from the start of scanning till the display of three dimensional image. Thereafter, the three dimensional position and range of a lesion can be clearly recognized on the basis of the three dimensional image, and hence efficient diagnosis can be performed. In addition, since the obtained two dimensional image becomes a perspective image, diagnosis based on the perspective image and the three dimensional image can be performed.

The embodiments of the present invention have been described above. However, the present invention is not limited to the above embodiments. Various changes and modifications can be made within the spirit and scope of the present invention.

What is claimed is:

1. A method for processing two and three dimensional data in an MRI (Magnetic Resonance Imaging) system, comprising the steps of:
   acquiring three dimensional data having a plurality of two dimensional data;
   storing the acquired three dimensional data;
   reading out one of the plurality of two dimensional data from the stored three dimensional data;

reconstructing a two dimensional image by a two dimensional Fourier transform process for the read out two dimensional data;
displaying the reconstructed two dimensional image;
reading out the stored three dimensional data;
reconstructing a three dimensional image by a three dimensional Fourier transform process for the read out three dimensional data; and
displaying the reconstructed three dimensional image after the reconstructed two dimensional image is displayed.

2. A method for processing two and three dimensional data in an MRI (Magnetic Resonance Imaging) system, comprising the steps of:
acquiring first two dimensional data of a subject;
reconstructing a two dimensional image by a two dimensional Fourier transform process for the acquired first two dimensional data;
acquiring a plurality of second two dimensional data of the subject outside the first two dimensional data, three dimensional data being constituted by the first and second two dimensional data;
displaying the reconstructed two dimensional image during the time second two dimensional data are acquired;
reconstructing a three dimensional image by a three dimensional Fourier transform process for the three dimensional data; and
displaying the reconstructed three-dimensional image.

3. The method according to claim 2, wherein the plurality of second two dimensional data outside the first two dimensional data is acquired immediately after the first two dimensional data is acquired.

4. An apparatus for processing two and three dimensional data in an MRI (Magnetic Resonance Imaging) system, comprising:
acquiring means for acquiring three dimensional data including a plurality of two dimensional data;
storing means for storing the acquired three dimensional data;
reconstructing means for reconstructing a two dimensional image by a two dimensional Fourier transform process for one of the plurality of two dimensional data included in the stored three dimensional data, and reconstructing a three dimensional image by a three dimensional Fourier transform process for the stored three dimensional data;
displaying means for displaying the reconstructed two dimensional image after the dimensional image is acquired and displaying the reconstructed three dimensional image after the reconstructed two dimensional image is displayed.

* * * * *